(12) United States Patent
Yeh et al.

(10) Patent No.: US 9,083,319 B2
(45) Date of Patent: Jul. 14, 2015

(54) OSCILLATOR AND CONTROL METHOD THEREOF

(75) Inventors: Ming-Yuh Yeh, Taipei (TW); Chen-Chih Huang, Hsin Chu County (TW); Tay-Her Tsaur, Tainan (TW)

(73) Assignee: REALTEK SEMICONDUCTOR CORP., Hsinchu (TW)

(*) Notice: Subject to any disclaimer, the term of this patent is extended or adjusted under 35 U.S.C. 154(b) by 106 days.

(21) Appl. No.: 13/049,368

(22) Filed: Mar. 16, 2011

(65) Prior Publication Data

US 2011/0227611 A1 Sep. 22, 2011

(30) Foreign Application Priority Data

Mar. 16, 2010 (TW) ................. 99107550 A

(51) Int. Cl.
*H03K 3/012* (2006.01)
*H03B 5/36* (2006.01)
*H03K 3/03* (2006.01)

(52) U.S. Cl.
CPC ............... *H03K 3/012* (2013.01); *H03B 5/36* (2013.01); *H03K 3/0307* (2013.01); *H03B 2200/0082* (2013.01)

(58) Field of Classification Search
USPC ......................................... 331/160, 183, 186
See application file for complete search history.

(56) References Cited

U.S. PATENT DOCUMENTS

| | | | |
|---|---|---|---|
| 5,614,851 A * | 3/1997 | Holzer et al. .................. 327/58 |
| 6,943,639 B2 * | 9/2005 | Dahlin ........................ 331/183 |
| 7,138,881 B2 | 11/2006 | Lin |
| 7,312,663 B2 | 12/2007 | Abel |
| 7,564,320 B2 | 7/2009 | Chiu et al. |
| 7,786,810 B2 * | 8/2010 | Liu et al. ........................ 331/17 |
| 8,102,217 B2 * | 1/2012 | Aoki ............................. 331/160 |
| 8,120,439 B2 * | 2/2012 | Shrivastava et al. .......... 331/160 |
| 2009/0045880 A1 | 2/2009 | Vanselow et al. |
| 2009/0284320 A1 | 11/2009 | Huang et al. |

FOREIGN PATENT DOCUMENTS

| | | |
|---|---|---|
| CN | 101609349 A | 12/2009 |
| TW | 200524285 A | 7/2005 |

OTHER PUBLICATIONS

English abstract translation of CN101609349 (Published Dec. 23, 2009).
CN Office Action dated Jan. 6, 2013.
Dennis Fischette: "First Time, Every Time—Practical Tips for Phase-Locked Loop Design"; Dec. 31, 2009.
TW Office Action dated Feb. 23, 2013.

* cited by examiner

*Primary Examiner* — Joseph Chang
(74) *Attorney, Agent, or Firm* — McClure, Qualey & Rodack, LLP

(57) ABSTRACT

An oscillator and the control method thereof. The oscillator includes an oscillation unit to receive a first current and to generate an oscillating signal according to the first current, a frequency-to-voltage converter to receive the oscillating signal and to generate a converted voltage according to a frequency of the oscillating signal, and a voltage-to-current converter to receive the converted voltage and to generate the first current according to the converted voltage, wherein the first current is modulated from a first value to a second value after the initiation of the oscillation unit.

17 Claims, 7 Drawing Sheets

OSCILLATOR AND CONTROL METHOD THEREOF

BACKGROUND OF THE INVENTION (a) Field of the Invention

The invention relates to an oscillator, particularly to an oscillator with power saving features and the method thereof.

(b) Description of the Related Art

FIG. 1 is a schematic diagram of a conventional oscillator 100, including an oscillation unit 101 and a crystal circuit 102. The oscillation unit 101 includes an inverter In and a resistor R. The crystal circuit 102 includes a piezoelectric quartz crystal Pi and two capacitors C1, C2.

The oscillation unit 101 generates an oscillating signal Xout by the piezoelectric quartz crystal Pi and capacitors C1, C2. In order to reach a target frequency rapidly during initiation, a large oscillation current (e.g., 3~6 mA, even larger) is applied to the oscillator 100. During the course of oscillator operation, the oscillation unit 101 and the capacitors C1, C2 generate negative resistance to counteract the equivalent series resistance (ESR) of the piezoelectric quartz crystal Pi to sustain the oscillation. However, the inverter In consistently consumes the relatively large first current during operation, which leads to unnecessary power consumption.

BRIEF SUMMARY OF THE INVENTION

In light of the above-mentioned problem, one object of the invention is to provide an oscillator with power saving features.

An embodiment of the invention is an oscillator including an oscillation unit, a frequency-to-voltage converter, and a voltage-to-current converter. The oscillation unit receives a first current and outputs an oscillating signal. The frequency-to-voltage converter generates a converted voltage according to the oscillating signal. The voltage-to-current converter adjusts the first current according to the converted voltage, which is determined by the oscillating signal after the oscillation unit is initiated.

Another embodiment of the invention is a method for controlling an oscillator. That is, to generate an first current that initiates an oscillating signal, to generate a converted voltage corresponding to the oscillating signal, and to adjust (reduce) the first current to save a power of the oscillator.

The oscillator and method thereof conceived according to the invention contribute to a decrease of power consumption while maintaining a substantially steady output frequency. The problem observed in prior art is solved by reducing first current intensity after the initiation, which does not interfere with the normal function.

DETAILED DESCRIPTION OF THE INVENTION

Reference will now be made in detail to the preferred embodiments of the present invention as illustrated in the accompanying drawings.

Figure 2A:
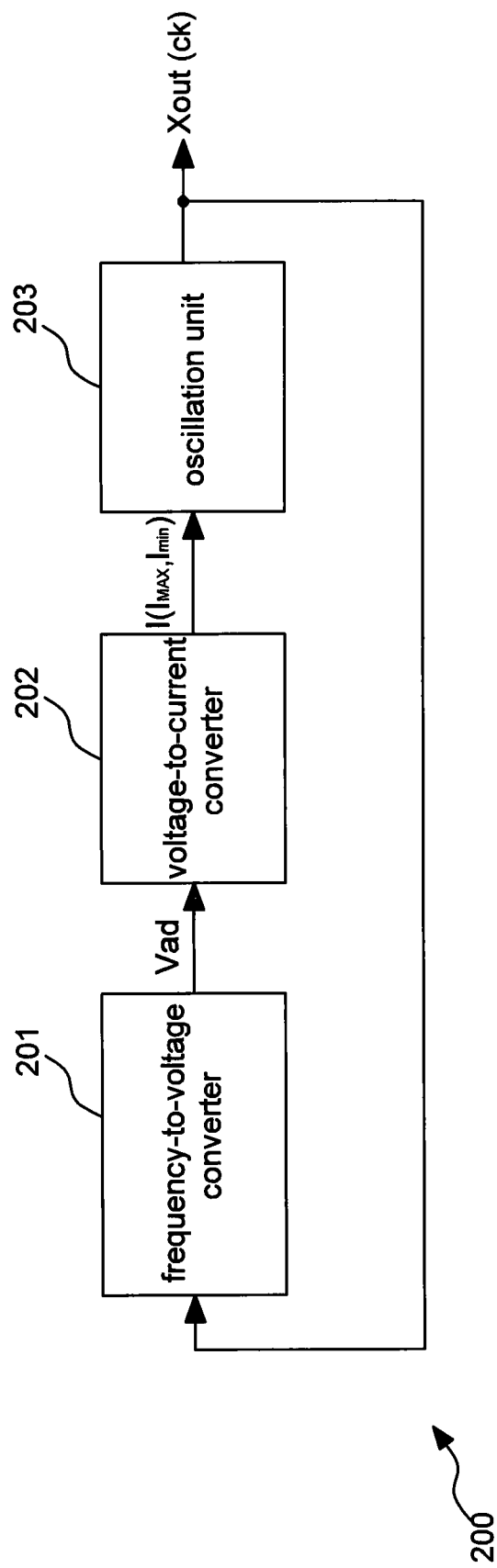
FIG. 2A is a block diagram illustrating a preferred embodiment of an oscillator.

FIG. 2A is a block diagram illustrating a preferred embodiment of the present invention. The oscillator 200 comprises an oscillation unit 203, a frequency-to-voltage converter 201, and a voltage-to-current converter 202.

Figure 1:
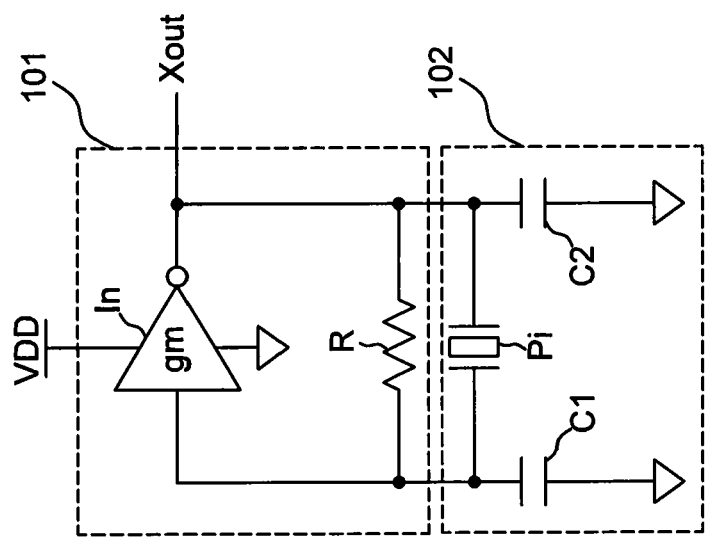
FIG. 1 is a schematic diagram of a conventional oscillator.

The oscillation unit 203 receives a current I and outputs an oscillating signal Xout. The oscillation unit 203 in this embodiment may be a replication of the oscillator shown in FIG. 1 or an oscillator of any other kind.

The frequency-to-voltage converter 201 is coupled to the oscillation unit 203 in order to detect the oscillating signal Xout, which determines a converted voltage Vad.

The voltage-to-current converter 202 is coupled to the frequency-to-voltage converter 201 in order to generate the current I, which is dependent on the converted voltage Vad.

It should be noted that the magnitude of the current I depends on the transconductance gm of the inverter In, which is generally located in the oscillation unit 203. The transconductance gm and the current I are respectively expressed by equations (1) and (2):

$$gm = k\left(\frac{W}{L}\right)\Delta V \quad (1)$$

$$I = \frac{k}{2}\left(\frac{W}{L}\right)\Delta V^2 \quad (2)$$

by eliminating $\Delta V$, equation (3) is obtained as:

$$I = \left(\frac{L}{2kW}\right) \times gm^2 \quad (3)$$

Based upon equation (3), the current I is proportional to the transconductance gm.

The transconductance gm of the inverter in the oscillation unit is usually set to correspond to an oscillation range to allow initiation of an oscillation or to maintain the oscillation frequency. If the transconductance gm is beyond the oscillation range, the oscillator will gradually stop the oscillation. If the transconductance gm is below the oscillation range, the oscillator will not be able to initiate the oscillation (corresponding to a null oscillation frequency). Furthermore, when the transconductance gm is within the oscillation range, a higher transconductance gm corresponds to a higher current I and is usually adopted in conventional designs to guarantee both a proper initiation and a faster acceleration of the initiation. Nonetheless, the power-consuming higher current I is no longer necessary when the oscillator reaches a target oscillation frequency, which makes the original design inadequate for energy saving products.

In a preferred embodiment, the oscillator 200 initiates with a higher current $I_{MAX}$ and triggers the oscillation of the oscillation unit 203. Afterwards, the oscillation unit 203 reaches the target oscillation frequency and maintains the frequency. The frequency-to-voltage converter 201 then modulates the converted voltage Vad according to the oscillating signal Xout while the voltage-to-current converter 202 reduces the current value from $I_{MAX}$ to $I_{min}$ (a current lower than $I_{MAX}$) in relation to the converted voltage Vad. It should be noted that currents $I_{MAX}$ and $I_{min}$ correspond to the transconductances gm that are within the oscillation range. Thus, the oscillation unit 203 will still function normally by outputting the oscillating signal Xout when the oscillator 200 operates with a current lower than $I_{MAX}$.

According to the foregoing operation, the current value of current I can be gradually decreased so as to reduce the power consumption after the initiation of the oscillation without interfering with the normal function of the oscillation unit 203.

Figure 2B:
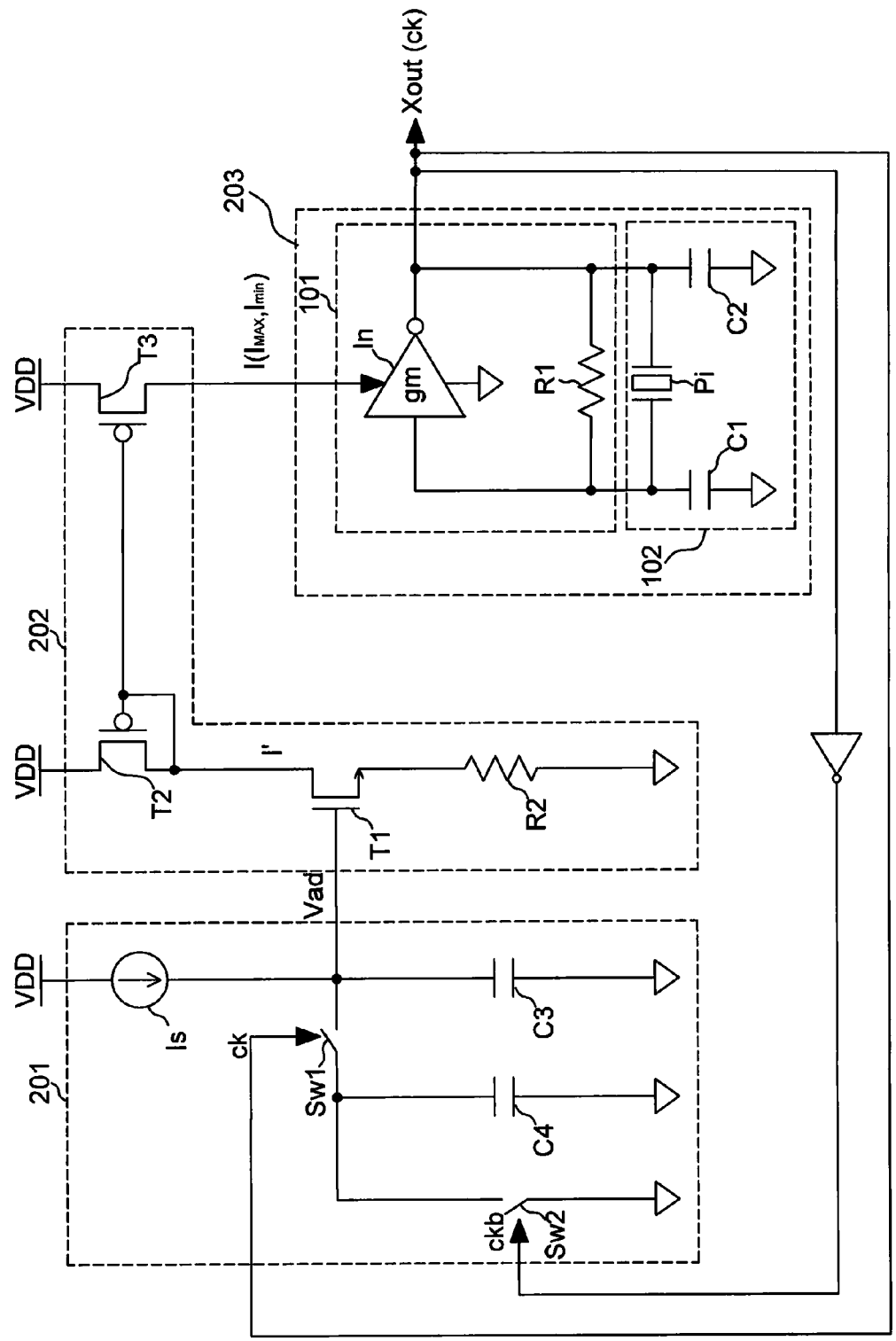
FIG. 2B is a schematic diagram illustrating the details of a preferred embodiment of an oscillator.

FIG. 2B is a schematic diagram illustrating the details of a preferred embodiment of the oscillator 200. The notation of electrical ground shown in the figure represents a ground voltage or a reference voltage of any value. The frequency-to-voltage converter 201 includes a current source Is, switches Sw1 and Sw2, and capacitors C3 and C4. The voltage-to-current converter 202 includes transistors T1, T2, and T3, and a resistor R2, and is implemented in a current mirror configuration.

Figure 2C:
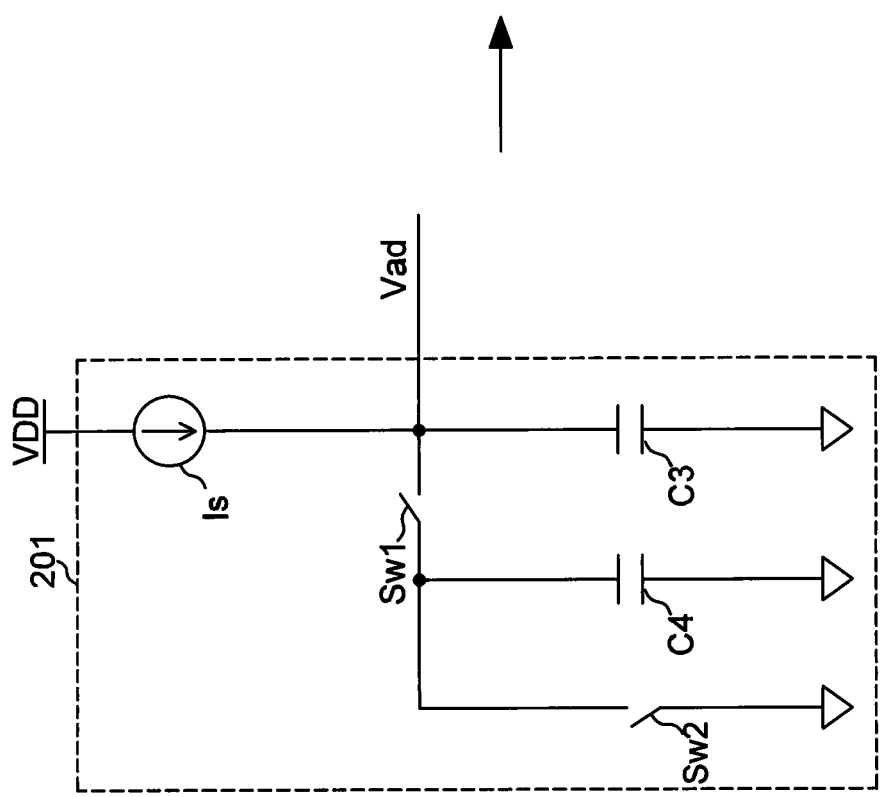
FIG. 2C is a schematic diagram illustrating a preferred embodiment of a frequency-to-voltage converter.
Figure 2C:
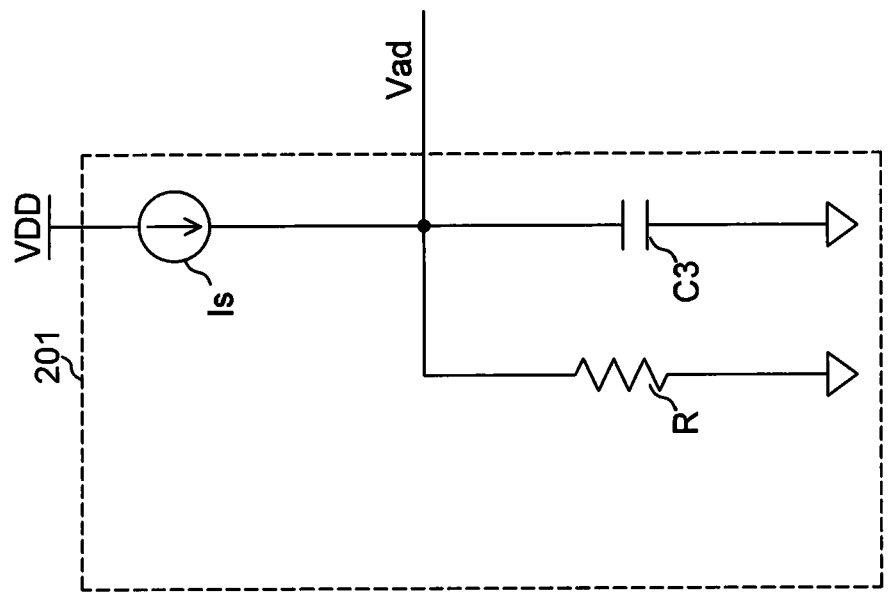

Please also refer to FIG. 2C where a preferred embodiment of the frequency-to-voltage converter 201 and its equivalent circuit is shown. The current source Is is coupled between the reference voltage VDD and the output of the converted voltage Vad, and the switches Sw1, Sw2 are switched on and off according to the oscillating signal Xout. By referring to FIG. 2C, during the switches Sw1 and Sw2 are switched according to the oscillating signal Xout, the switches Sw1, Sw2 and the capacitor C4 (capacitance denoted by C4) can be considered as an equivalent resistor R (resistance denoted by R), and the frequency f of the oscillating signal Xout can be expressed by the following equation (4):

$$f = \frac{1}{RC4} \quad (4)$$

which means that the resistance of the equivalent resistor R can be expressed by the following equation (5):

$$R = \frac{1}{fC4} \quad (5)$$

The converted voltage Vad at the output can be expressed by the following equation (6):

$$Vad = Is \times R \quad (6)$$

Subsequently, the equations (5) and (6) are combined by eliminating R, yielding the following equation (7):

$$Vad = Is \times \frac{1}{fC4} = \frac{Is}{fC4} \quad (7)$$

The equation (7) implies that a lower frequency f corresponds to a higher converted voltage Vad. The converted voltage Vad can be initially represented by a first voltage level $V_{MAX}$ before the initiation of the oscillator (f=0). After the initiation, the frequency f will increase (corresponding to a gradual decrease of the converted voltage Vad from $V_{MAX}$) until it reaches a preset value (corresponding to the converted voltage Vad fixed at a second voltage level $V_{min}$). After the oscillating signal Xout is fixed at a frequency f, the converted voltage Vad is then set at the value derived from equation (7).

Therefore, the specifications of the capacitor C4 and the current source Is can be determined in advance by referencing the frequency f of the oscillating signal Xout so that the oscillator 200 can continue to operate at the frequency f after initiation, that is, in a power saving mode.

By referring to FIG. 2B and FIG. 2C at the same time, a more detailed description of the preferred embodiment is set forth below. The converted voltage Vad is set at the voltage level $V_{MAX}$ during the initiation of the oscillator 200 by receiving current from the current source Is. This generates a corresponding current I' (via the control of the transistor T1) and mirrors a current I in the voltage-to-current converter 202. The oscillation unit 203 is initiated by the current I set at $I_{MAX}$ and the piezoelectric quartz crystal Pi and capacitors C1, C2 of the crystal circuit 102 generate the oscillating signal Xout, accordingly.

After the corresponding frequency of the oscillating signal Xout reaches the preset frequency, the oscillation unit 203 can be driven by another lower current $I_{min}$ to maintain normal function. The switches Sw1, Sw2 are switched on or off according to the clock ck and its invert ckb, which are determined by the oscillating signal Xout. By charging and discharging the capacitors C3, C4 with the switches Sw1, Sw2, the magnitude of the converted voltage Vad is adjusted accordingly. That is, the capacitors C3, C4 are charged when the switches Sw1, Sw2 are respectively turned on and off according to the clocks ck and ckb, whereas the capacitor C4 is discharged (via switch Sw2 to electrical ground) when the switches Sw1, Sw2 are respectively turned off and on according to the clocks ck and ckb. Hence, the converted voltage Vad is reduced during the increase of frequency f (please refer to equation (7)). This implies that once the preset frequency is reached, the converted voltage Vad can be decreased to a preset voltage level $V_{min}$ and the transistor T1 of the voltage-to-current converter 202 can regulate the current I' according to the preset voltage level $V_{min}$ and reduce the output current I. Apparently, since the current I is relevant to the oscillating signal Xout, a power saving current value $I_{min}$ corresponding to the lowest voltage $V_{min}$ can be set according to the frequency f during a steady-state oscillation.

Figure 3A:
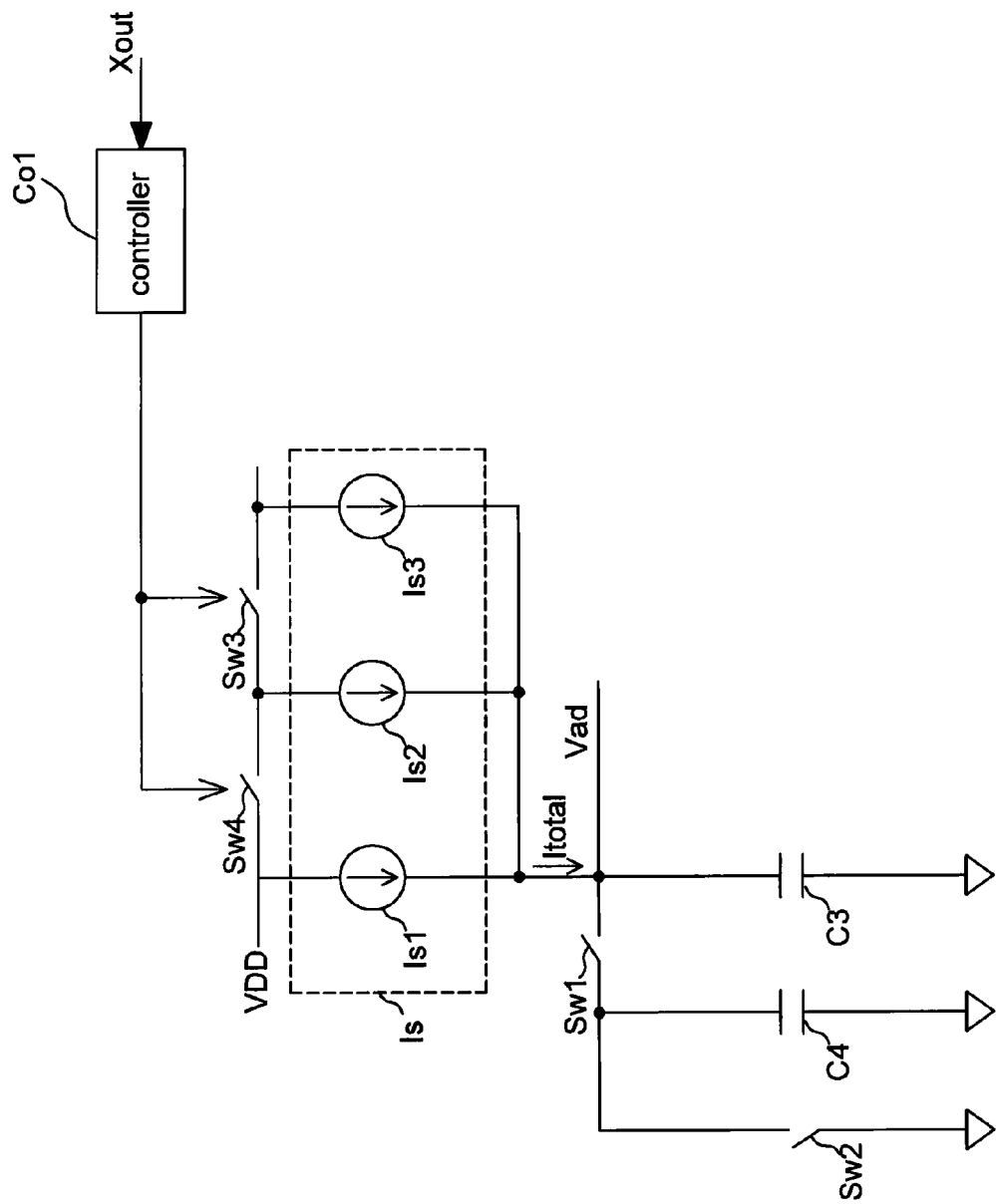
FIG. 3A is a schematic diagram illustrating another preferred embodiment of a frequency-to-voltage converter.
Figure 3B:
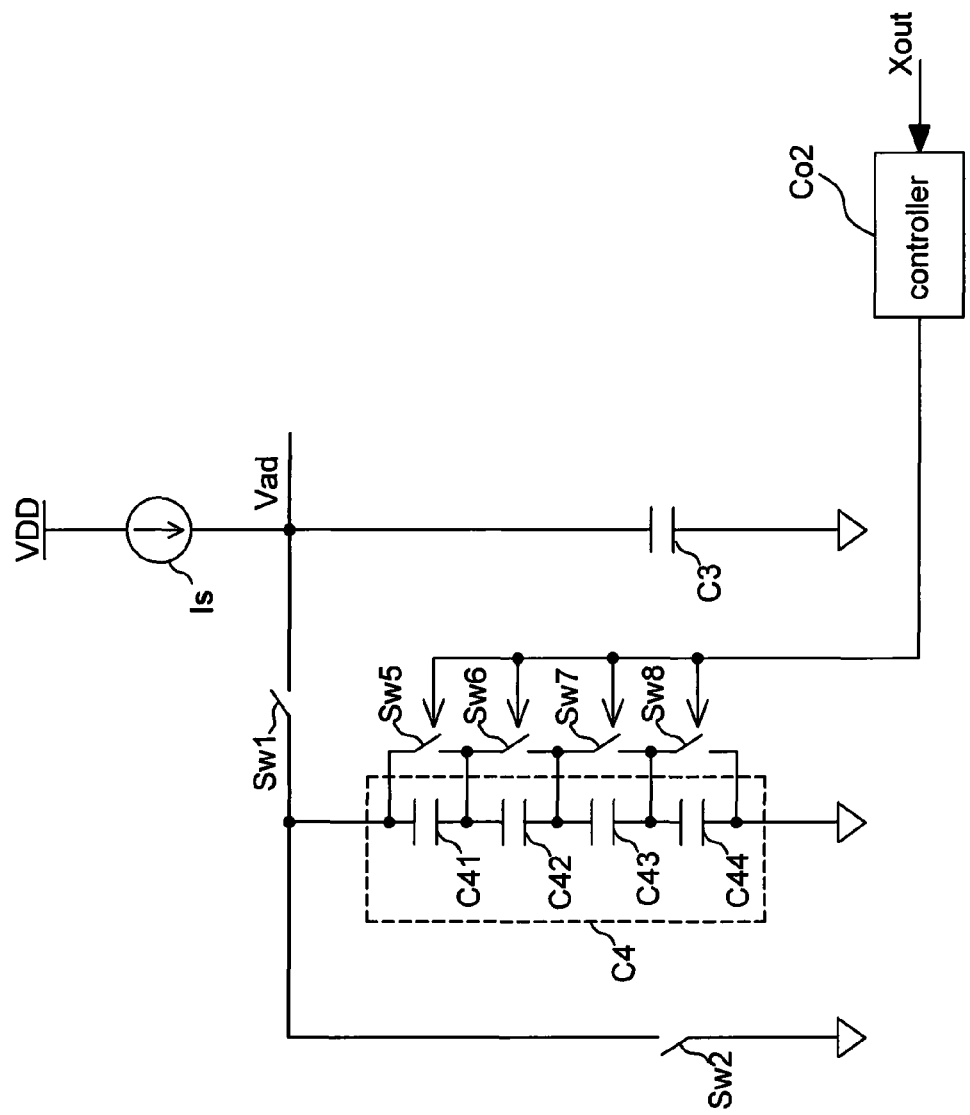
FIG. 3B is a schematic diagram illustrating another preferred embodiment of a frequency-to-voltage converter.

Please refer to FIG. 3A and FIG. 3B which illustrate embodiments that suggest the use of a controller (Co1 or Co2) to modulate the output current of the voltage-to-current converter by detecting the oscillating signal. FIG. 3A is a schematic diagram illustrating a preferred embodiment of a frequency-to-voltage converter. In this embodiment, the current source Is (please note that the current source is not equivalent to the current I) is a variable current source that can be divided into multiple smaller current sources Is1, Is2 and Is3 (the number of smaller current sources is not limited). The controller Co1 detects the oscillating signal Xout and turns on or off the switches Sw3, Sw4 to modulate the output current Itotal of the current source Is, which places the oscillation unit 203 in the most appropriate power saving mode. The following is an example of the detecting and switching processes that enable the power saving. During an initial stage, the controller Co1 presets by turning on the switch Sw4 and turning off the switch Sw3, which generates a total current of Itotal=Is1+Is2. This total current Itotal charges the capacitors and generates the initial converted voltage Vad. Nonetheless, if the converted voltage Vad does not initiate an oscillation, the controller Co1 turns on an additional switch Sw3 to generate additional total current Itotal=Is1+Is2+Is3 since the controller Co1 was unable to detect the oscillating signal Xout. Hence, the converted voltage Vad is increased so that the oscillation unit 203 can start to oscillate and generate the oscillating signal Xout. On the other hand, if the total current Itotal=Is1+Is2 is sufficient to initiate an oscillation, the controller Co1 will attempt to turn off the switch Sw4 to reduce the converted voltage Vad. However, if the oscillating signal Xout dies out when both the switches Sw3, Sw4 are turned off, the controller Co1 may turn on the switch Sw4 again to reinitiate the oscillation. Preferably, the controller Co1 may incorporate a memory component to store the optimal operating details according to previous operations of the controller Co1 so as to achieve the best possible solution for the purpose of energy savings.

FIG. 3B is a schematic diagram illustrating another preferred embodiment of a frequency-to-voltage converter. The capacitor C4 can be a variable capacitor, comprising a multiple number of capacitors C41, C42, C43, and C44 (the number of capacitors is not limited). The controller Co2 detects the oscillating signal Xout and turns on or off the switches Sw5, Sw6, Sw7, and Sw8 to determine the optimal capacitance of the variable capacitor C4 so as to achieve the best possible solution for energy savings. Preferably, the controller Co2 may also incorporate a memory component to store optimal operating details for the purpose of energy savings.

In another embodiment, the controller may directly control the intensity of the current I in the voltage-to-current converter. For example, the controller may regulate the current I by changing the current mirror ratio.

It should be noted that the controllers Co1 and Co2 may incorporate memory components in the form of internal memory or external memory (e.g. portable memory), which is a custom-made approach implemented specifically for certain configurations. For example, the controller can be designed to work without a memory component and can either make the judgment during each operation or respond according to an external memory that stores optimal operating details from time to time. Those skilled in the art should understand that they can make various changes, substitutions and alterations of both the frequency-to-voltage converter and the voltage-to-current converter, thus the foregoing components will not be further elaborated.

Figure 4:
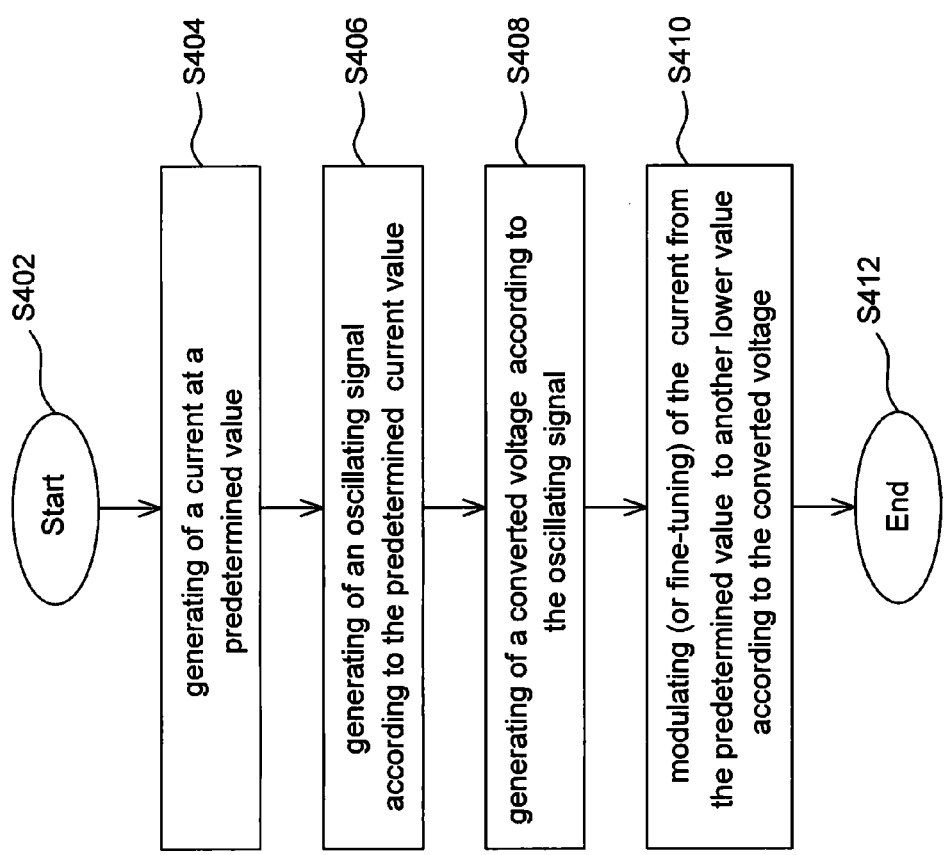
FIG. 4 is a flow chart illustrating a preferred embodiment of a method for controlling an oscillator.

FIG. 4 is a flow chart illustrating a preferred embodiment of a method for controlling an oscillator. By referring to FIG. 2A and FIG. 4 at the same time, the method for controlling an oscillator is described as follows. The start step S402 represents an initiation of oscillation, the step S404 indicates the generating of a current at a predetermined value $I_{MAX}$, the step S406 indicates the generating of an oscillating signal Xout according to the predetermined current value $I_{MAX}$) the step S408 indicates the generating of a converted voltage Vad according to the oscillating signal Xout, the step S410 indicates the modulating (or fine-tuning) of the current from the predetermined value $I_{MAX}$ to another lower value $I_{min}$ according to the converted voltage Vad (to operate in a power saving mode), and the stop step S412 represents a halt after the oscillating signal Xout is being steadily generated.

The following example is an actual case where the specific characteristic of the oscillation unit 203 is disregarded but labeled with an oscillation frequency of 25 MHz. The typical ratings of the current I supplied to the oscillation unit 203 for an initiation is usually at least 3 mA and may exceed 6 mA in some process variations. Hence, the conventional approach is to supply more than 3 mA (or even more than 6 mA) to the oscillation unit 203, even after the oscillation is in a steady course. The embodied method presents an approach that modulates the current I to a relevantly lower value (typically lower than 1 mA or 500 μA), which is still capable of maintaining the normal operation of the oscillation unit 203. As a result, power consumption is reduced and the oscillator 200 is optimized for normal operation in the power saving mode.

The aforementioned embodiments are still capable of solving flaws in cases when the transconductance gm are made beyond the oscillation range (e.g. due to process variations) which corresponds to a predetermined current value that is too large. Under such circumstances, the current as well as the transconductance gm, are reduced to the oscillation range so that the oscillator will not have to stop (please refer to the foregoing paragraphs for details).

Although the present invention has been fully described by the above embodiments, the embodiments should not constitute the limitation of the scope of the invention. Various modifications or changes can be made by those who are skilled in the art without deviating from the spirit of the invention.

What is claimed is:

1. An oscillator, comprising:
an oscillation unit configured to receive a first current and to generate an oscillating signal according to the first current;
a frequency-to-voltage converter comprising at least one switch and a current source, the frequency-to-voltage converter being configured to receive the oscillating signal, the frequency-to-voltage converter being configured to generate a converted voltage according to a varied frequency of the oscillating signal, the frequency-to-voltage converter comprising a controller configured to detect the oscillating signal and reduce the converted voltage while maintaining oscillation of the oscillating signal by enabling one of a plurality of combinations of current sources; and
a voltage-to-current converter to receive the converted voltage and to generate the first current according to the converted voltage;
wherein the voltage-to-current converter is configured to modulate the first current from a first value to a second value after the initiation of the oscillation unit, wherein the oscillation unit comprises an inverter with a transconductance within an oscillation range that enables oscillation, wherein the first value and the second value of the first current correspond to transconductance values within the oscillation range.

2. The oscillator according to claim 1, wherein the converted voltage is reduced according to the increase of the frequency of the oscillating signal.

3. The oscillator according to claim 1, wherein the second value is less than the first value.

4. The oscillator according to claim 3, wherein the first current set at the second value enables the oscillator to operate in a power saving mode.

5. The oscillator according to claim 1, wherein the first current intensity is substantially proportional to the squared transconductance.

6. The oscillator according to claim 1, wherein the frequency-to-voltage converter comprises a first switch, a second switch, a first capacitor, and a second capacitor.

7. The oscillator according to claim 6, wherein the first switch, the second switch, and the second capacitor generate an equivalent resistance parallel to the first capacitor, and modulates the oscillating signal.

8. The oscillator according to claim 6, wherein the current source is a variable current source.

9. The oscillator according to claim 7, wherein the current source comprises a plurality of parallel current units and a corresponding plurality of third switches coupled to the parallel current source units to generate different levels of current intensity to the output terminal.

10. The oscillator according to claim 6, wherein the second capacitor comprises a plurality of capacitors and a corresponding plurality of switches to determine the capacitance of the second capacitor.

11. The oscillator according to claim 1, wherein the voltage-to-current converter is a current mirror circuit.

12. A method for controlling an oscillator, comprising the steps of:
  generating a first current;
  generating, by an oscillation unit, an oscillating signal according to the first current;
  generating, by a frequency-to-voltage converter, a converted voltage according to a varied frequency of the oscillating signal, wherein the oscillation unit comprises an inverter with a transconductance within an oscillation range that enables oscillation; and
  reducing, by a controller in the frequency-to-voltage converter, the converted voltage by adjusting the first current from a first value to a second value by enabling one of a plurality of combinations of current sources according to the oscillating signal to reduce a power consumption of the oscillator, wherein the first value and the second value of the first current correspond to transconductance values within the oscillation range.

13. The method according to claim 12, wherein the step for generating a converted voltage is by reducing the converted voltage in relation to the frequency of the oscillating signal.

14. The method according to claim 12, wherein the converted voltage is reduced according to the increase of the frequency of the oscillation signal.

15. The method according to claim 12, wherein the second value is less than the first value.

16. An oscillator, comprising:
  an oscillation unit configured to receive a first current and to generate an oscillating signal according to the first current;
  a frequency-to-voltage converter configured to receive the oscillating signal and to generate a converted voltage according to a frequency of the oscillating signal, wherein the frequency-to-voltage converter comprises a current source, a first switch, a second switch, a first capacitor, and a second capacitor, the frequency-to-voltage converter comprising a controller configured to detect the oscillating signal and reduce the converted voltage while maintaining oscillation of the oscillating signal by enabling one of a plurality of combinations of current sources; and
  a voltage-to-current converter configured to receive the converted voltage and to generate the first current according to the converted voltage;
  wherein the voltage-to-current converter is configured to adjust the first current from a first value to a second value, wherein the oscillation unit comprises an inverter with a transconductance within an oscillation range that enables oscillation, wherein the first value and the second value of the first current correspond to transconductance values within the oscillation range.

17. The oscillator according to claim 16, wherein the first switch, the second switch, and the second capacitor generate an equivalent resistance parallel to the first capacitor, and wherein the first switch and the second switch are turned on and off according to the oscillating signal.

\* \* \* \* \*